(12) United States Patent
Tanaka

(10) Patent No.: US 10,061,338 B2
(45) Date of Patent: Aug. 28, 2018

(54) SEMICONDUCTOR DEVICE AND METHOD OF CONTROLLING THEREOF

(71) Applicant: LAPIS Semiconductor Co., Ltd., Yokohama (JP)

(72) Inventor: Kouhei Tanaka, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 132 days.

(21) Appl. No.: 15/086,640

(22) Filed: Mar. 31, 2016

(65) Prior Publication Data

US 2016/0291626 A1 Oct. 6, 2016

(30) Foreign Application Priority Data

Mar. 31, 2015 (JP) ................................. 2015-071345

(51) Int. Cl.
| | |
|---|---|
| *G05F 3/02* | (2006.01) |
| *H03K 19/0175* | (2006.01) |
| *H02M 3/07* | (2006.01) |
| *G09G 3/36* | (2006.01) |

(52) U.S. Cl.
CPC ....... *G05F 3/02* (2013.01); *H03K 19/017509* (2013.01); *G09G 3/36* (2013.01); *H02M 3/07* (2013.01); *Y02E 10/56* (2013.01)

(58) Field of Classification Search
None
See application file for complete search history.

(56) References Cited

U.S. PATENT DOCUMENTS

2002/0033721 A1* 3/2002 Tachimori .............. H03K 3/013
327/158

FOREIGN PATENT DOCUMENTS

JP H11-14961 A 1/1999

* cited by examiner

*Primary Examiner* — Gustavo Polo
(74) *Attorney, Agent, or Firm* — Rabin & Berdo, P.C.

(57) ABSTRACT

A semiconductor device for controlling a display device includes a generation unit configured to generate a reference voltage, a booster unit configured to boost the reference voltage to generate a bias voltage, and a conversion unit. The conversion unit receives a status signal generated from a power supply voltage and is configured to boost a voltage level of the status signal to that of the bias voltage for controlling drive of the display device. A control unit is configured to stop operation of at least one of the generation unit and the booster unit when one of a value of the power supply voltage and a value of a power supply current flowing from a power supply that generates the power supply voltage is lower than a predetermined threshold.

19 Claims, 15 Drawing Sheets

SEMICONDUCTOR DEVICE AND METHOD OF CONTROLLING THEREOF

CROSS-REFERENCE TO RELATED APPLICATION

This application is based on, and claims priority to, Japanese Patent Application No. 2015-071345, filed on Mar. 31, 2015, contents of which are incorporated herein by reference.

BACKGROUND OF THE INVENTION

Technical Field

The present invention relates to a semiconductor device and a method of controlling thereof.

Background Art

A booster circuit or a level shifter (converter) is generally used for a conventional drive circuit configured to control the driving of a liquid crystal device (see, for example, Japanese Laid-Open Patent Publication 1999-014961). Also, a high voltage transistor is generally used as a switching element for a booster circuit which performs a boost operation where the reference voltage is boosted by a factor of 3 so that the switching element for the boost operation does not break.

Also, when a high voltage transistor is used for a booster circuit, since the on-resistance of the high voltage transistor is relatively great while the drain current is relative small, the boost efficiency of the booster circuit and the consequent display quality of the liquid crystal display device are reduced. In order to achieve a good display quality of the liquid crystal display device (by increasing the boost efficiency), the size of the high voltage transistor is increased so as to reduce its on-resistance and to increase the drain current.

SUMMARY OF THE INVENTION

However, the booster circuit for which the above-described measures have been taken tends to maintain a relatively high boost efficiency (e.g., 80% or so) even when the boost operation uses a relatively low voltage. Accordingly, a through current may flow through the level shifter when a display signal having a voltage generated from a power supply voltage, that is lower than the power supply voltage is converted into a bias current generated by the booster circuit. When the power supply voltage is below a predetermined value, the through current is generated if the difference between the voltage value of the display signal and the value of the bias voltage becomes great.

Also, as the through current flows through the level shifter, the display device may exhibit flickering and/or increase the power consumption of the entire device.

Japanese Laid-Open Patent Publication 1999-014961 discloses a technique for suppressing flickering in a liquid crystal display device, caused by a through current flowing through a level shifter when a battery is removed and the power supply voltage supplied to the level shifter due to the electrostatic capacity of a condenser becomes less than the minimum operation voltage for the level shifter. However, the technique disclosed in Japanese Laid-Open Patent Publication 1999-014961 may be problematic in that the method of suppressing the flickering where electric charge accumulated in the condenser is discharged by creating a short circuit between the liquid crystal driving voltage and the reference voltage (GND), may stop the entire operation of the device.

The present invention is directed toward solving the above-stated problem, and provides a semiconductor device operable to suppress a through current from flowing through a converter without stopping the entire operation of the device.

The invention is applied to a semiconductor device for controlling a display device, which may include a generation unit configured to generate a reference voltage, a boosting unit configured to boost the reference voltage to generate a bias voltage, a level shifter configured to convert (shift) a voltage level of a status signal to that of the bias voltage, for controlling the drive of the display device. In such a semiconductor device, the status signal is generated from a power supply voltage, and a control unit configured to stop an operation of one or both of the generation unit and the boosting unit when either the power supply voltage or a power supply current flowing from a power supply that generates the power supply voltage, is lower than a predetermined threshold.

Further, the invention is applied to a semiconductor device for controlling a display device, that includes a generation unit configured to generate a reference voltage, a boosting unit configured to boost the reference voltage based on a clock signal to generate a bias voltage, a conversion unit, receiving a status signal and being configured to convert a voltage level of the status signal to that of the bias voltage, for controlling drive of the display device, the status signal being generated from a power supply voltage, and a switching unit configured to, switch between outputting and not outputting the clock signal after the clock signal is inputted thereto depending on whether or not one of the power supply voltage and the power supply current from the power supply is equal to or greater than a predetermined threshold.

Furthermore, the invention is applied to a method of controlling a semiconductor device for controlling a display device, that includes generating a reference voltage, boosting the reference voltage to generate a bias voltage, generating a status signal from a power supply voltage and converting a voltage level of the status signal to that of the bias voltage, for controlling drive of the display device, and stopping operation of either or both of the generation and the boosting of the reference voltage when either the power supply voltage or a power supply current flowing from a power supply that generates the power supply voltage is lower than a predetermined threshold.

The above and other objects, features and advantages of the invention will become more fully understood from the detailed description given hereinbelow and the accompanying drawings which are given by way of illustration only, and thus are not to be considered as limiting the invention.

DETAILED DESCRIPTION OF THE INVENTION

Hereinafter, embodiments of the invention will be described with reference to the accompanying drawings.

<First Embodiment>

First, a configuration of a semiconductor device 10A according to a first embodiment will be described with reference to FIG. 1.

Figure 1:
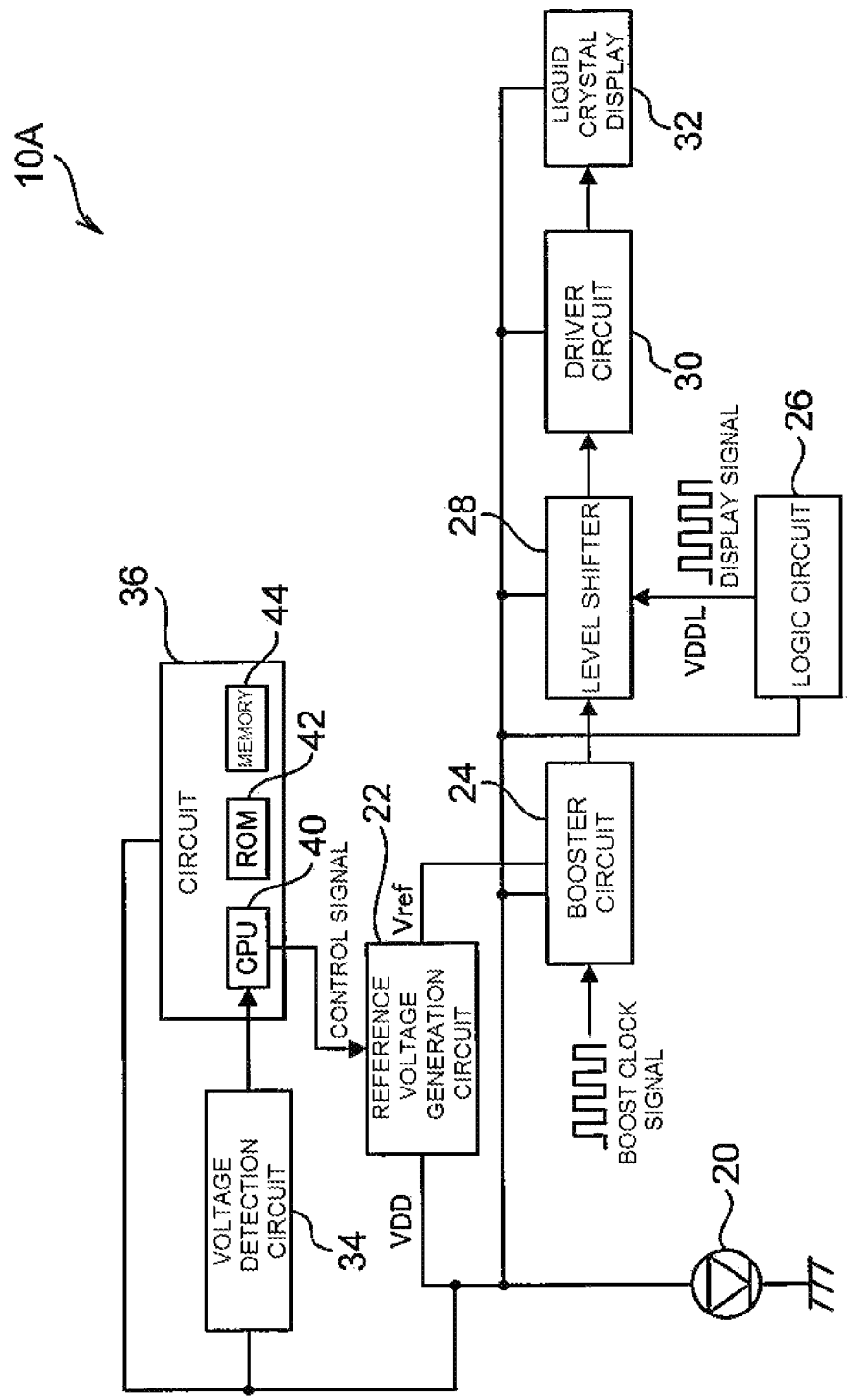
FIG. 1 is a block diagram illustrating an example of a configuration of a semiconductor device according to a first embodiment.

As illustrated in FIG. 1, the semiconductor device 10A includes a reference voltage generation circuit 22, to which a solar battery 20 is connected, a booster circuit 24, a logic circuit 26, a level shifter 28, a driver circuit 30, a voltage detection circuit 34, and another circuit 36.

The solar cell 20 includes a battery configured to convert light (hereinafter also "light energy") such as sunlight, into electrical energy so as to supply to constituent parts a power supply voltage VDD corresponding to the light energy.

The reference voltage generation circuit 22 generates reference voltage Vref from the power supply voltage VDD, and outputs the generated reference voltage Vref to the booster circuit 24. The booster circuit 24 generates a bias voltage by boosting the reference voltage Vref received from the reference voltage generation circuit 22 by a factor of N (N=3 according to the first embodiment) based on a clock signal, and outputs the boosted voltage N-Vref as the bias voltage to the level shifter 28. The booster circuit 24 may be includes a charge pump circuit. However, the booster circuit 24 is not limited to such a configuration. For example, the booster circuit 24 may alternatively include a circuit other than a charge pump circuit such as an inductor, or the like.

The logic circuit 26 generates from the power supply voltage VDD a status signal for controlling the drive of a liquid crystal display 32, and outputs the status signal to the level shifter 28. The status signal has a voltage VDDL lower than the power supply voltage VDD. The level shifter 28 converts (shifts) the electrical potential of the status signal from VDDL to the level of the boosted voltage (N-Vref) that is the bias voltage received from the booster circuit 24, and outputs the converted status signal (hereinafter referred to as "post conversion signal") to the driver circuit 30.

The driver circuit 30 outputs a signal configured to control the display (turned on) and non-display (turned off) of the liquid crystal display device 32 based on the received post-conversion signal. The liquid crystal display device 32 includes, for example, what are called 7 segment type LEDs (Light Emitting Diodes), which are turned on or off in each segment in accordance with a signal inputted to a segment terminal and a common terminal. Note that while not illustrated in FIG. 1 for the sake of simplicity, the configuration according to the first embodiment may include, for example, as many of the level shifters 28 as the number of the segment terminals and the common terminals. Also, one example of the present embodiment may include one driver circuit 30 for a predetermined number of level shifters 28 (2 according to the embodiment although as noted above only one is illustrated for the sake of simplicity).

A voltage detection circuit 34 detects the value of the power supply voltage VDD supplied from the solar battery 20, and outputs the voltage value to a CPU (Central Processing Unit) 40 programmed as described below. The circuit 36 includes circuitry necessary for the operation of the constituent parts of the semiconductor 10A other than what was described above. The circuit 36 includes, for example, the CPU 40, configured to control the operation of the whole semiconductor device 10A, a ROM (Read Only Memory) 42 that store various programs and parameters or the like, and a nonvolatile memory 44 such as a flash memory.

The CPU 40 acquires the value of the power supply voltage VDD from the voltage detection circuit 34, and outputs a control signal configured to control the operation of the reference voltage generation circuit 22 in accordance with the acquired voltage value. To be more specific, when the value of the power supply voltage VDD is below a predetermined threshold V1 the CPU 40 outputs a stop signal to the circuit 22 to stop its operation. Also, when the value of the power supply voltage VDD is equal to or greater than the predetermined threshold V1 the CPU 40 outputs to the reference voltage generation circuit 22 a drive signal to start its operation. Note that the threshold V1 may have a predetermined value (with or without a fixed margin added thereto) such as a lower limit of the power supply voltage VDD, determined experimentally, at which a through current starts to flow through the level shifter 28. Such a determination can be made, for example, using the semiconductor device 10A or a computer simulation of the device based on its design specification.

Meanwhile, the reference voltage generation circuit 22 remains in a drive state while receiving the drive signal from the CPU 40, and performs normal operations. Also, the reference voltage generation circuit 22 remains in a stop state while continuing to receive the stop signal from the CPU 40.

Figure 2:
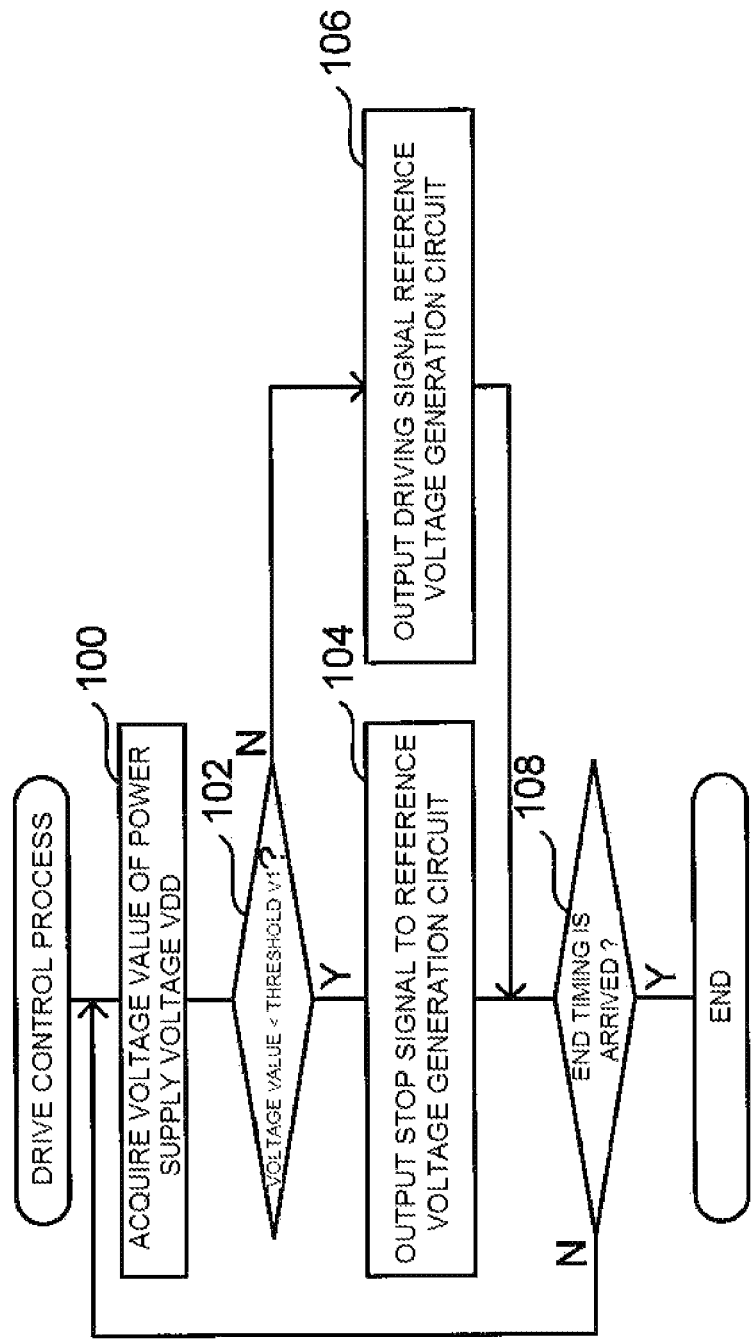
FIG. 2 is a flowchart illustrating an example of a flow of a drive control process according to the first embodiment.

Next, a function of the semiconductor device 10A will be described with reference to FIG. 2. Note that FIG. 2 is a flowchart illustrating an example of a flow of a drive control process program performed by the CPU 40 when power for driving the device begins to be supplied to a power terminal of the semiconductor device 10A. Also, the drive control process program is preinstalled in the ROM 42.

In Step 100 in FIG. 2 the CPU 40 acquires the value of the power supply voltage VDD detected by the voltage detection circuit 34. Then in Step 102, the CPU 40 makes a determination as to whether or not the value of the power supply voltage VDD acquired in Step 100 is below the threshold V1. The CPU 40 moves to Step 106 when it is determined that the value of the power supply voltage VDD is equal to or greater than the threshold V1. On the other hand, when it is determined that the value of the power supply voltage VDD is below the threshold V1, the CPU 40 moves to Step 104.

In Step 104 the CPU 40 outputs the above-stated stop signal to the reference voltage generation circuit 22. The circuit 22 stops the operation while the stop signal continues to be received. Also, when the operation of the reference voltage generation circuit 22 is stopped, the boost operation by the booster circuit 24 also is no longer executed, which stops the input of bias voltage to the level shifter 28. Accordingly, when the conversion operation by the level shifter 28 is not executed, the through current is suppressed from flowing to the level shifter 28.

In Step 106 the CPU 40 outputs the above-stated drive signal to the reference voltage generation circuit 22. The circuit 22 remains in the drive state while continuing to receive the drive signal. Also, when the operation of the circuit 22 is started and the circuit goes into the drive state, the boost operation by the booster circuit 24 is started. By this operation, the bias voltage is inputted to the level shifter 28, and thereby the semiconductor device 10A starts its normal operation.

In Step 108 the CPU 40 makes a determination as to whether or not a predetermined end time has arrived. When the CPU 40 determines that an end time has not yet arrived, the program moves back to the Step 100; on the other hand, when the CPU 40 determines that the end time has arrived, the performance of the drive control process by CPU 40 ends. According to the first embodiment, the above-stated end time can be, for example, when the power for driving the device stops being supplied to a power terminal of the semiconductor device 10A.

Further, while the CPU 40 outputs the above-stated drive signal and stop signal to the reference voltage generation circuit 22 in a direct manner, the invention is not limited thereto. The semiconductor device 10A may for example be configured to switch, when triggered by information corresponding to the drive signal or stop signal written at a predetermined area of a register or the memory 44, to switch the reference voltage generation circuit 22 between the drive state and stop state. In such cases, the CPU 40 may, instead of performing Step 104 as described above, execute a process where the CPU 40 stores information corresponding to the above-stated stop signal at the predetermined area of the memory 44, for example. Also, the CPU 40 may, instead performing Step 106 as described above, execute a process where the CPU 40 stores information corresponding to the above-stated drive signal at the predetermined area of the memory 44.

According to the description above, the first embodiment is described as a drive control process realized by software that executes a program. However, the invention is not limited thereto. The above-stated drive control process may be realized for example by a hardware configuration or a combination of a hardware configuration and software. In the description below, a first modification in which the drive control process is realized by hardware will be described.

A configuration of a semiconductor device 10B according to the first modification will be described with reference to FIG. 3. Note that the elements illustrated in FIG. 3 having the same function as those illustrated in FIG. 1 will be denoted with the same reference numerals as those in FIG. 1, and detailed description thereof will be omitted.

Figure 3:
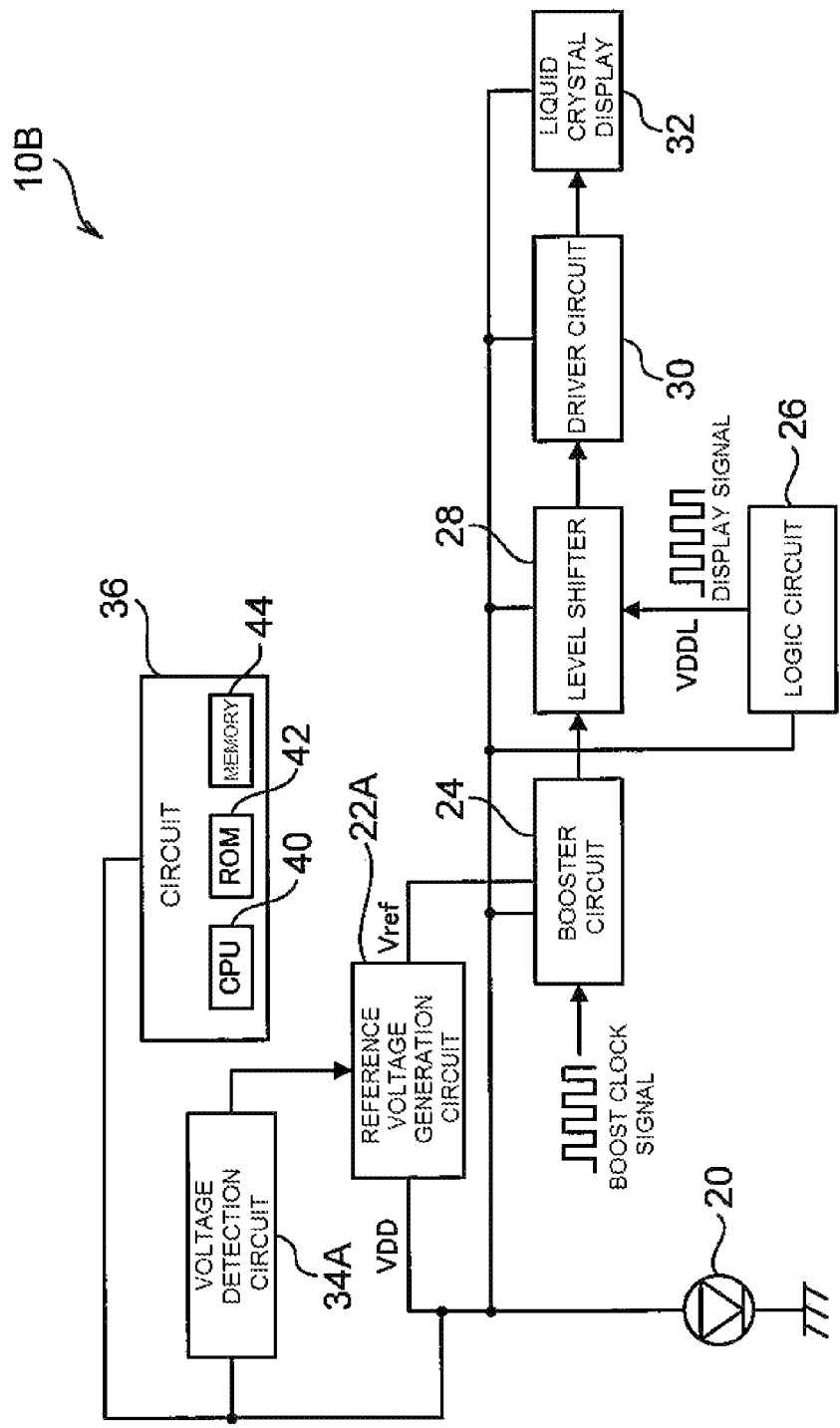
FIG. 3 is a block diagram illustrating an example of a configuration of a semiconductor device according to a first modification of the first embodiment.

As illustrated in FIG. 3, the semiconductor device 10B includes a reference voltage generation circuit 22A instead of the reference voltage generation circuit 22 described in the first embodiment. Also, the semiconductor device 10B includes a voltage detection circuit 34A instead of the voltage detection circuit 34 according to the first embodiment.

The voltage detection circuit 34A detects the value of the power supply voltage VDD supplied from the solar battery 20, and, when the detected voltage value is equal to or greater than the threshold V1, outputs a high level signal to the reference voltage generation circuit 22A. Also, the voltage detection circuit 34A outputs a low level signal to the circuit 22A when the detected voltage value is less than the threshold V1.

The reference voltage generation circuit 22A remains in a drive state while the voltage detection circuit 34A keeps inputting the high level signal to the circuit 22A, and performs normal operations. On the other hand, the circuit 22A remains in a stop state while the low level signal continues to be received from the voltage detection circuit 34A.

Next, a configuration of the voltage detection circuit 34A according to the present modification will be described with reference to FIG. 4. For convenience of description an N channel type MOS field effect transistor will be referred to as an NMOS transistor. Also, for convenience of description a P channel type MOS field effect transistor will be referred to as a PMOS transistor.

Figure 4:
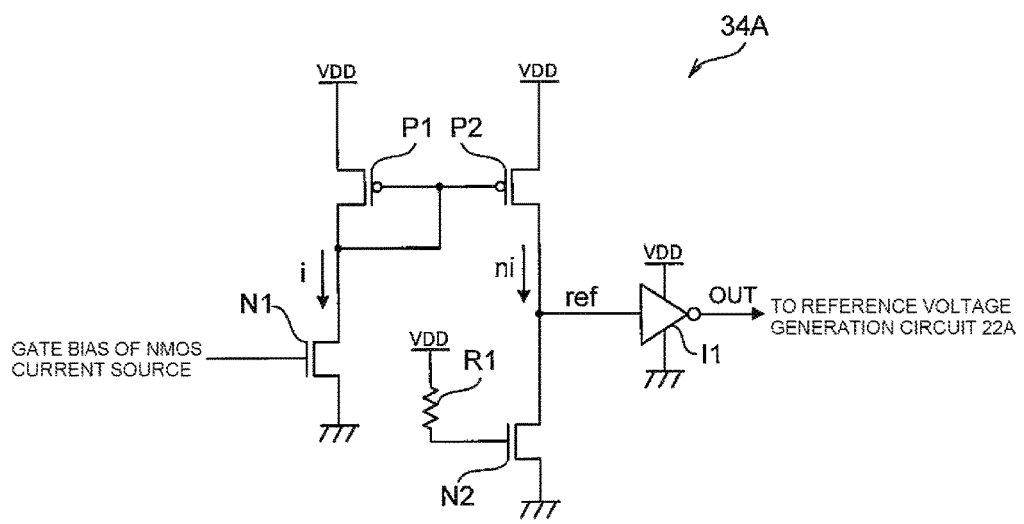
FIG. 4 is a circuit diagram illustrating an example of a configuration of a voltage detection circuit according to the modification of the first embodiment.

As is illustrated in FIG. 4, the voltage detection circuit 34A according to the first modification includes a resistance element R1, NMOS transistors N1 and N2, PMOS transistors P1 and P2, and an inverter I1. Sources of the PMOS transistors P1 and P2 are each connected with a power supply line which supplies the power supply voltage VDD. The drain of the PMOS transistor P1 is connected with a drain the NMOS transistor N1, while the drain of the PMOS transistor P2 is connected with the drain for the NMOS transistor N2. The gate of the PMOS transistor P1 is connected with the drain of the PMOS transistor P1 and the gate of the PMOS transistor P2.

A gate bias signal from the power supply of the NMOS transistor N1 is inputted to the gate of the NMOS transistor N1. The gate of the NMOS transistor N2 is connected with a power line configured to supply the power supply voltage VDD via the resistance element R1. Sources for the NMOS transistors N1 and N2 are each grounded. A connection point ref between the drain of the PMOS transistor P2 and the drain of the NMOS transistor N2 is connected with an input terminal of the inverter I1. An output signal OUT from the inverter I1 is inputted to the reference voltage generation circuit 22A as an output signal from the voltage detection circuit 34A.

Here, an operation of the voltage detection circuit 34A according to the first modification will be described. When the gate bias signal is inputted to the gate of the NMOS transistor N1, a bias current i flows to the NMOS transistor N1. Then, a current ni that corresponds to the bias current i flows to the connection point ref. Accordingly, an electrical potential of the connection point ref inputted to the inverter I1 will be determined based on the value of the current ni. Note that the current ni includes the bias current i multiplied by n in accordance with the areas of the PMOS transistor P1 and the PMOS transistor P2.

The NMOS transistor N2 includes a threshold voltage which is configured such that when the value of the power supply voltage VDD is equal to or greater than the threshold V1 it is in an ON state, and when the voltage value is less than the threshold V1 it is in an OFF state. Accordingly, when the value of the power supply voltage VDD is lower than the threshold V1, the NMOS transistor N2 is in an OFF state, the voltage at the connection point ref is close to the power supply voltage VDD, and the output signal OUT from the inverter I1 becomes a low level signal. On the other hand, when the value of the power supply voltage VDD is equal to or greater than the threshold V1, the NMOS transistor N2 is in an ON state, the voltage at the connection point ref is close to the ground potential of the power supply, and the output signal OUT from the inverter I1 becomes a high level signal.

Figure 5:
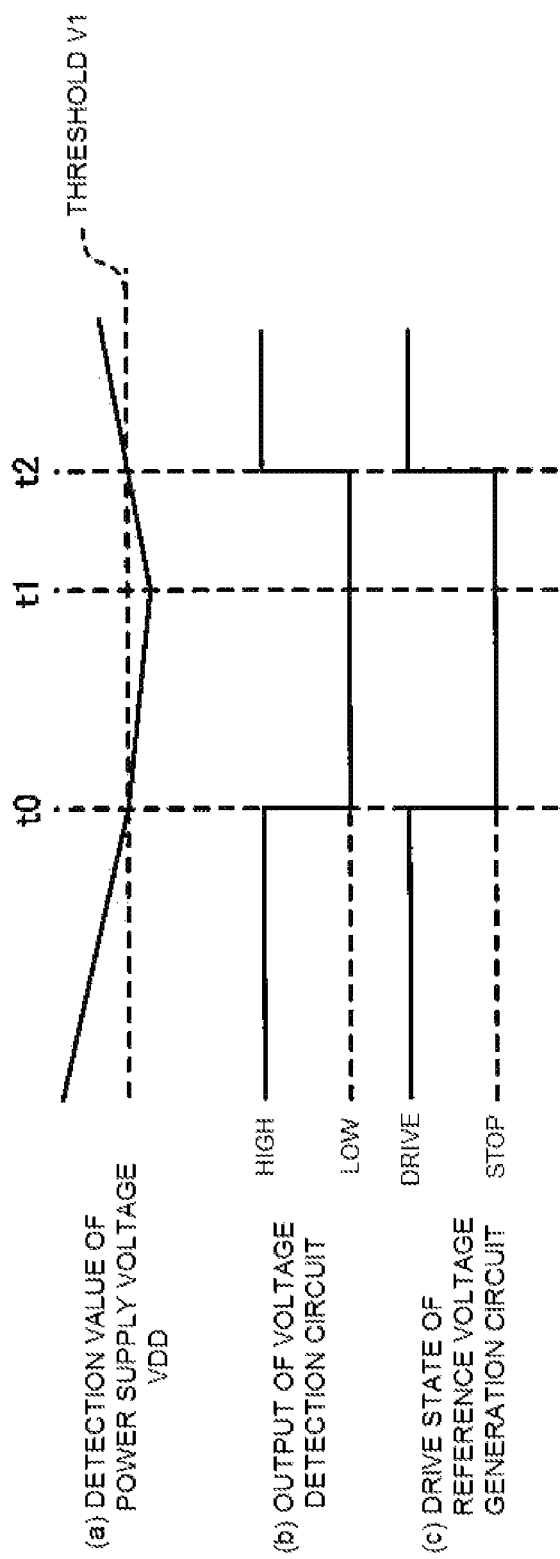
FIG. 5 is a timing chart illustrating an example of an operation of a semiconductor device according to the first modification of the first embodiment.

Next, operation of the semiconductor apparatus 10B according to the first modification will be described with reference to FIG. 5. Graph (a) in FIG. 5 shows a value of the power supply voltage VDD detected by the voltage detection circuit 34A, Graph (b) in FIG. 5 shows the output signal from the voltage detection circuit 34A, and Graph (c) in FIG. 5 schematically shows an action state of the reference voltage generation circuit 22A. A broken line in Graph (c) shows the threshold V1. Note that to avoid complication the description below assumes that the value of the power supply voltage VDD is equal to or greater than the threshold V1, that each constituent part of the semiconductor device 10B performs its normal operation, and that a point in time when the light energy entering the solar battery 20 begins to diminish and the power supply voltage VDD begins to correspondingly go down is used as a start point (farthest left in FIG. 5).

As illustrated in FIG. 5, the value of the power supply voltage VDD is lowered following the reduction of the light energy, and the detected value of the power supply voltage VDD becomes less than the threshold V1 at a time t0. Accordingly, the output signal from the voltage detection circuit 34A switches from a high level to a low level at the time t0. Following the switching of the output signal, the action state of the reference voltage generation circuit 22A switches from the drive state to the stop state.

Next, at time t1, the light energy begins to increase and, following this increase, the value of the power supply voltage VDD increases. Then the detected value of the power supply voltage VDD becomes equal to or greater than the threshold V1 at a time t2. Accordingly, the output signal from the voltage detection circuit 34A at the time t2 is switched from a low level to a high level. Following the switching of the output signal, the action state of the reference voltage generation circuit 22A switches from the stop state to the drive state.

As described above, according to the first embodiment and its described modification, when the value of the power supply voltage VDD becomes lower than the threshold V1 only the operation of the reference voltage generation circuit 22 or 22B stops. Accordingly, it becomes possible to suppress a through current from flowing through the level shifter 28 without stopping the entire device.

In particular, since a through current is suppressed from flowing through the level shifter 28 while the entire semiconductor device 10A or 10B starts, and the power used to drive the device begins to be supplied to the power terminals thereof, it becomes possible to suppress the increase of power consumption, which would normally occur due to the through current when the device starts. Accordingly, it becomes possible to shorten the starting time of the semiconductor devices 10A and 10B.

As explained above, in the first embodiment and the first modification, the actions of the reference voltage generation circuits 22 and 22A stop when the value of the power supply voltage VDD is lower than the threshold V1. However, the invention is not limited thereto. The action of the booster circuit 24 may be stopped, or the actions of the reference voltage generation circuits 22 and 22A and the action of the booster circuit 24 may be stopped, for example, when the value of the power supply voltage VDD is less than the threshold V1.

Figure 6:
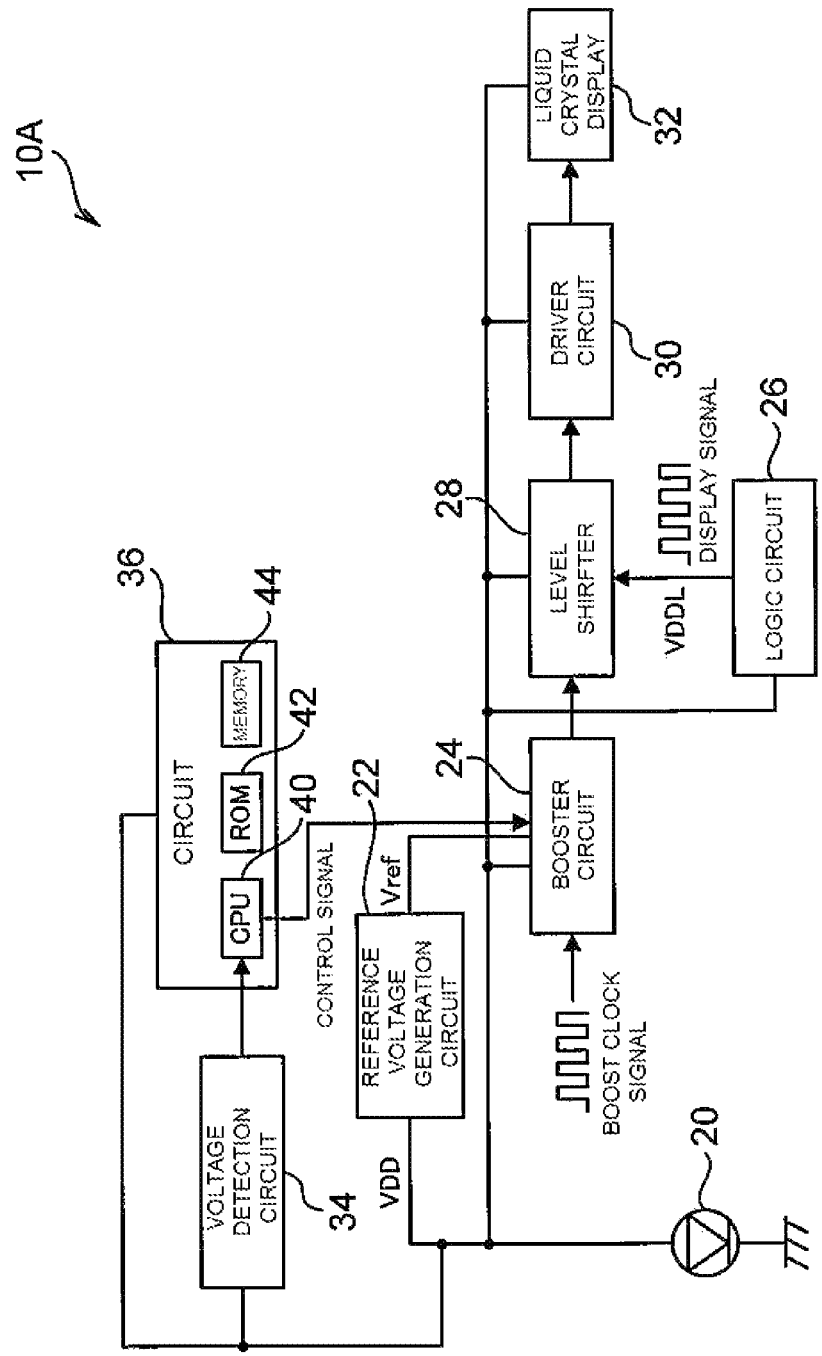
FIG. 6 is a block diagram illustrating an example of a configuration of a semiconductor device according to a second modification of the first embodiment.
Figure 7:
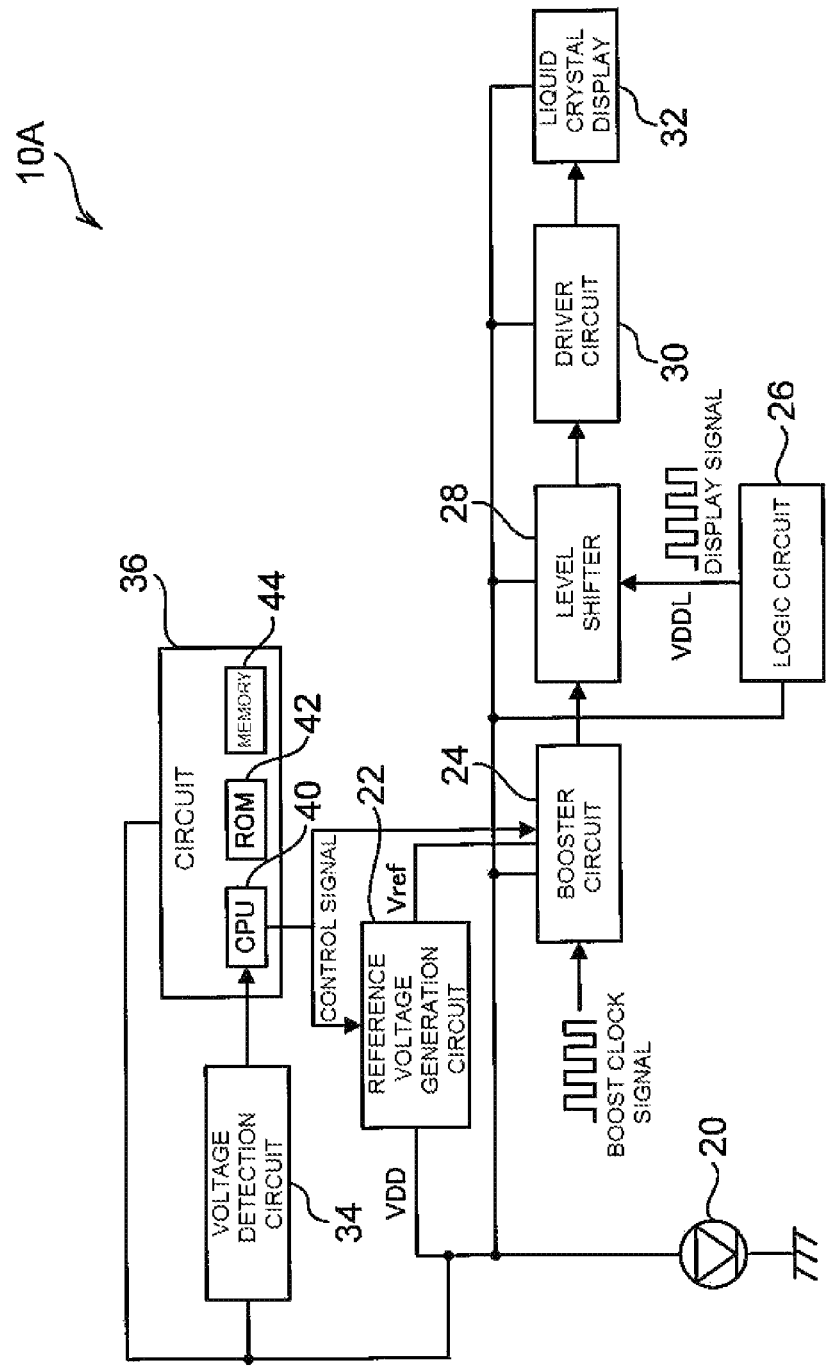
FIG. 7 is a block diagram illustrating an example of a configuration of a semiconductor device according to a third modification of the first embodiment.

To be more specific, when the action of the booster circuit 24 of the first software embodiment is to be stopped, the stop signal and/or the drive signal are outputted from the CPU 40 to the booster circuit 24 in the manner illustrated in FIG. 6. In such a case, the action state of the booster circuit 24 switches from the drive state to the stop state and vice versa in accordance with the signals inputted thereto in the same manner as the reference voltage generation circuit 22 according to the first embodiment. Also, when the action state of both the reference voltage generation circuit 22 and that of the booster circuit 24 are chosen to be stopped, the stop signal and/or the drive signal are outputted to both the reference voltage generation circuit 22 and the booster circuit 24 in the manner shown in FIG. 7. In such a case, the action state of the reference voltage generation circuit 22 and that of the booster circuit 24 switch from the drive state to the stop state and vice versa in accordance with the signals inputted thereto in the same manner as the reference voltage generation circuit 22 according to the first embodiment.

Figure 8:
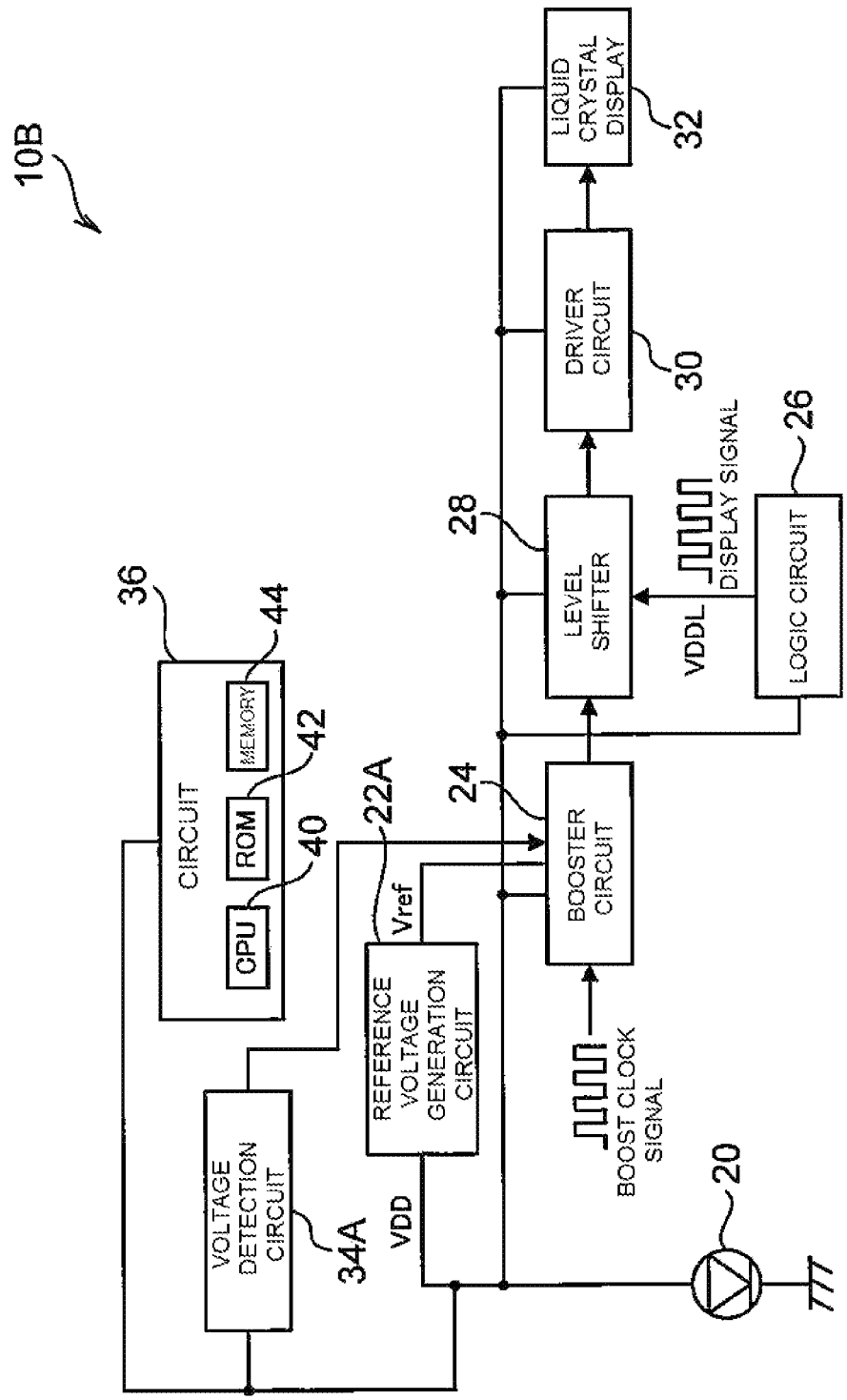
FIG. 8 is a block diagram illustrating an example of a configuration of a semiconductor device according to a fourth modification of the first embodiment.
Figure 9:
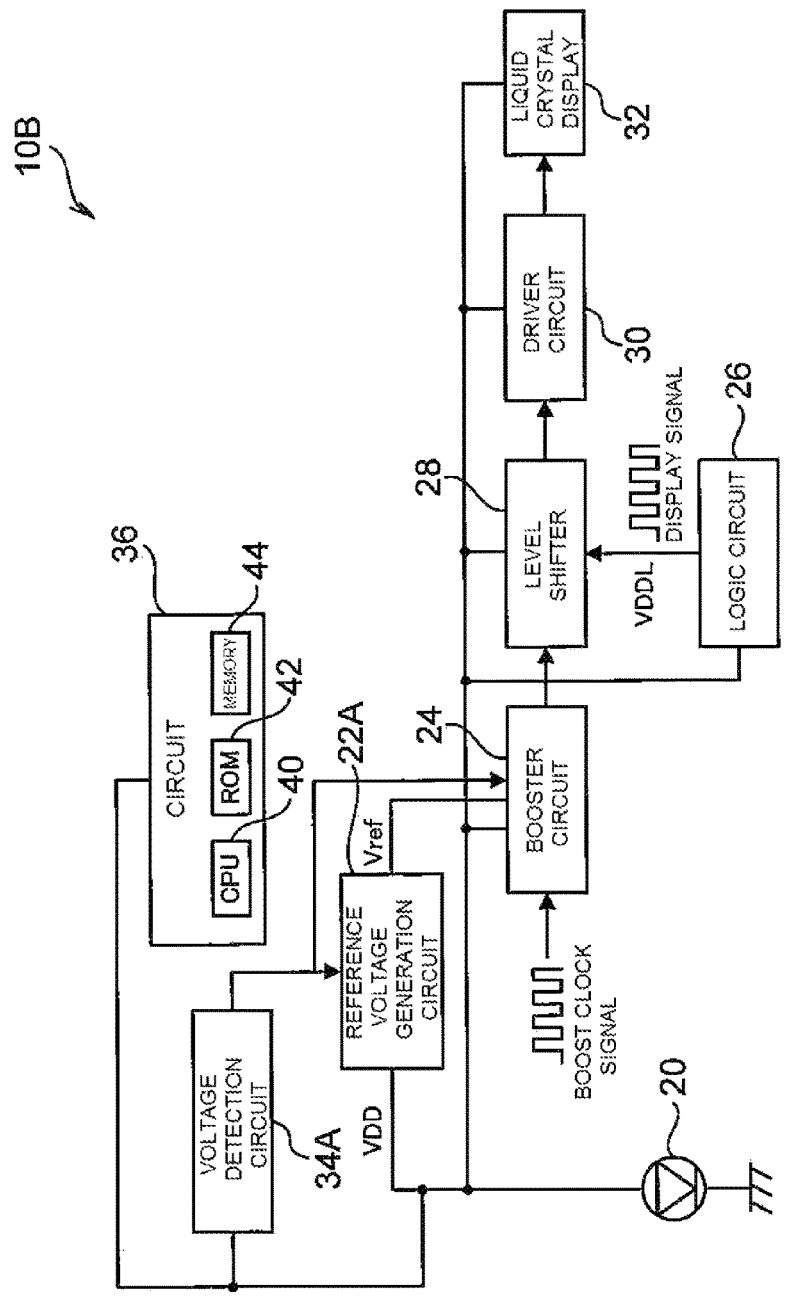
FIG. 9 is a block diagram illustrating an example of a configuration of a semiconductor device according to a fifth modification of the first embodiment.

Also, when the action state of the booster circuit 24 is to be stopped in accordance with the above-described hardware modification of the first embodiment, the low level signal and/or the high level signal is outputted from the voltage detection circuit 34A to the booster circuit 24 in the manner shown in FIG. 8. In such a case, the action state of the booster circuit 24 switches from the drive state to the stop state and vice versa in accordance with the signals inputted thereto in the same manner as the reference voltage generation circuit 22 according to the modification of the first embodiment. Also, in the hardware modification of the first embodiment, when the action state of both the reference voltage generation circuit 22A and that of the booster circuit 24 are chosen to be stopped, the high level signal and/or the low level signal are outputted to both the reference voltage generation circuit 22A and the booster circuit 24 in the manner shown in FIG. 9. In such case, the action state of the reference voltage generation circuit 22A and that of the booster circuit 24 switch from the drive state to the stop state and vice versa in accordance with the signals inputted thereto in the same manner as described above for the reference voltage generation circuit 22A.

<Second Embodiment>

Figure 10:
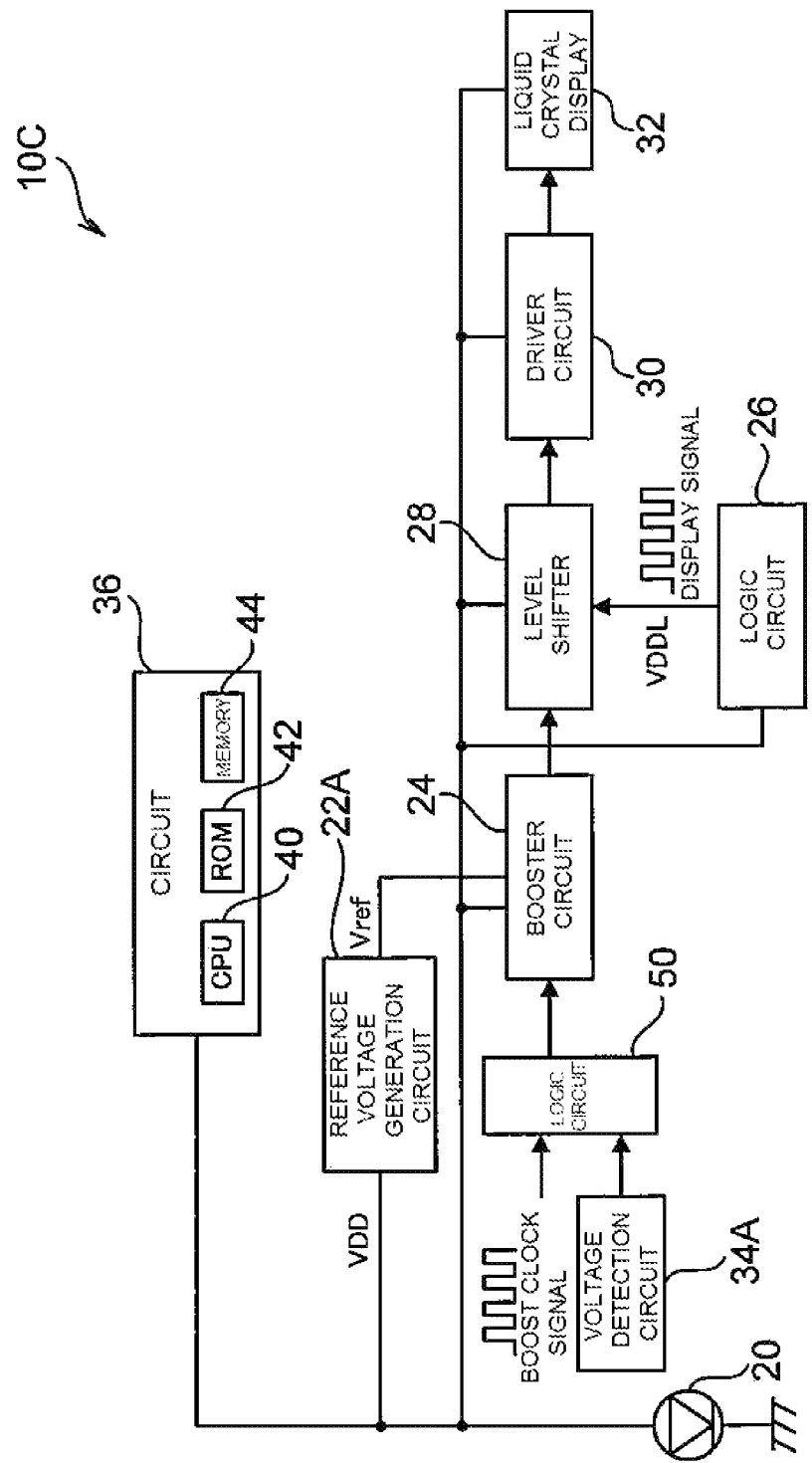
FIG. 10 is a block diagram illustrating an example of a configuration of a semiconductor device according to a second embodiment.

Next, a hardware configuration of a semiconductor device 10C according to the second embodiment will be described with reference to FIG. 10. Note that the constituent parts illustrated in FIG. 10 having the same functions as those illustrated in FIG. 3 will be denoted with the same reference numerals as those in FIG. 3 and detailed description thereof will be omitted.

The semiconductor device 10C further includes a logic circuit 50. The above-described booster clock signal and the output signal from the voltage detection circuit 34A are each inputted to the logic circuit 50.

The logic circuit 50 outputs, when a high level signal is inputted thereto from the voltage detection circuit 34A, the booster clock signal as is to the booster circuit 24. On the other hand, the logic circuit 50 stops outputting the booster clock signal to the booster circuit 24 when a low signal is inputted thereto from the voltage detection circuit 34A. Note that the logic circuit 50 includes, for example, an AND circuit.

Figure 11:
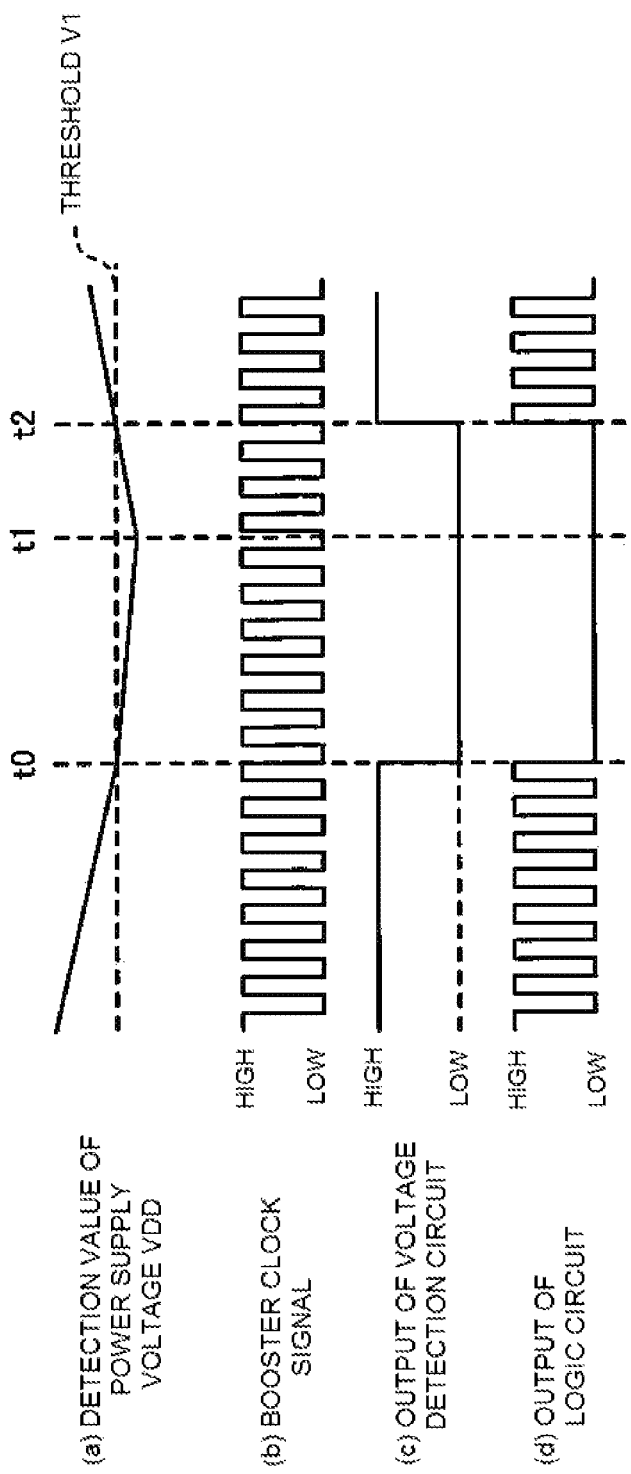
FIG. 11 is a timing chart illustrating an example of an operation of the semiconductor device according to the modification of the second embodiment.

Next, operation of the semiconductor device 10C according to the second embodiment will be described with reference to FIG. 11. FIG. 11 shows, in the same manner as the hardware modification of the first embodiment described above (see FIG. 5), a value of the power supply voltage VDD detected by the voltage detection circuit 34A (Graph (a) of FIG. 11). Time t0 through t2 in FIG. 11 are the same as those according to the hardware modification of the first embodiment described above with reference to FIG. 5. Graph (b) of FIG. 11 shows the booster clock signal, Graph (c) of FIG. 11 shows an output signal from the voltage detection circuit 34A, and Graph (d) of FIG. 11 shows an output signal from the logic circuit 50.

As illustrated in FIG. 11, at a time t0 the output signal from the voltage detection circuit 34A switches from a high level signal to a low level signal. Following this switching of the output signal, the logic circuit 50 stops outputting booster clock signals. Also, when the logic circuit 50 stops outputting the booster clock signals, a boost operation by the booster circuit 24 also stops, which stops the input of a bias voltage to the level shifter 28. Accordingly, when the conversion operation by the level shifter 28 is not executed, it enables suppression of the through current from flowing to the level shifter 28.

At a time t2 the output signal from the voltage detection circuit 34A switches from the low level to the high level. Following the switching of the output signal, the logic circuit 50 starts outputting the booster clock signals. Also, when the logic circuit 50 starts outputting the booster clock signals the booster circuit 24 starts the boost operation, which starts the input of bias current to the level shifter 28 and normal operation by the semiconductor device 10C.

As described above, the second embodiment is operable to obtain similar effects as those obtained by the first embodiment. Also, according to the second embodiment, whether the logic circuit 50 outputs or stops outputting the booster clock signal is switched depending on whether or not the value of the power supply voltage VDD is equal to or greater than the threshold V1. Accordingly, it becomes possible to stop the boost operation by the booster circuit 24 more quickly compared to the first embodiment where the drive signals are used, and therefore the operation of the entire device can be activated more quickly.

<Third Embodiment>

A configuration of a semiconductor device 10D according to the third embodiment will now be described with reference to FIG. 12. Note that the constituent parts illustrated in FIG. 12 having the same function as those illustrated in FIG. 10 will be denoted with the same reference numerals as those in FIG. 10 and detailed description thereof will be omitted.

Figure 12:
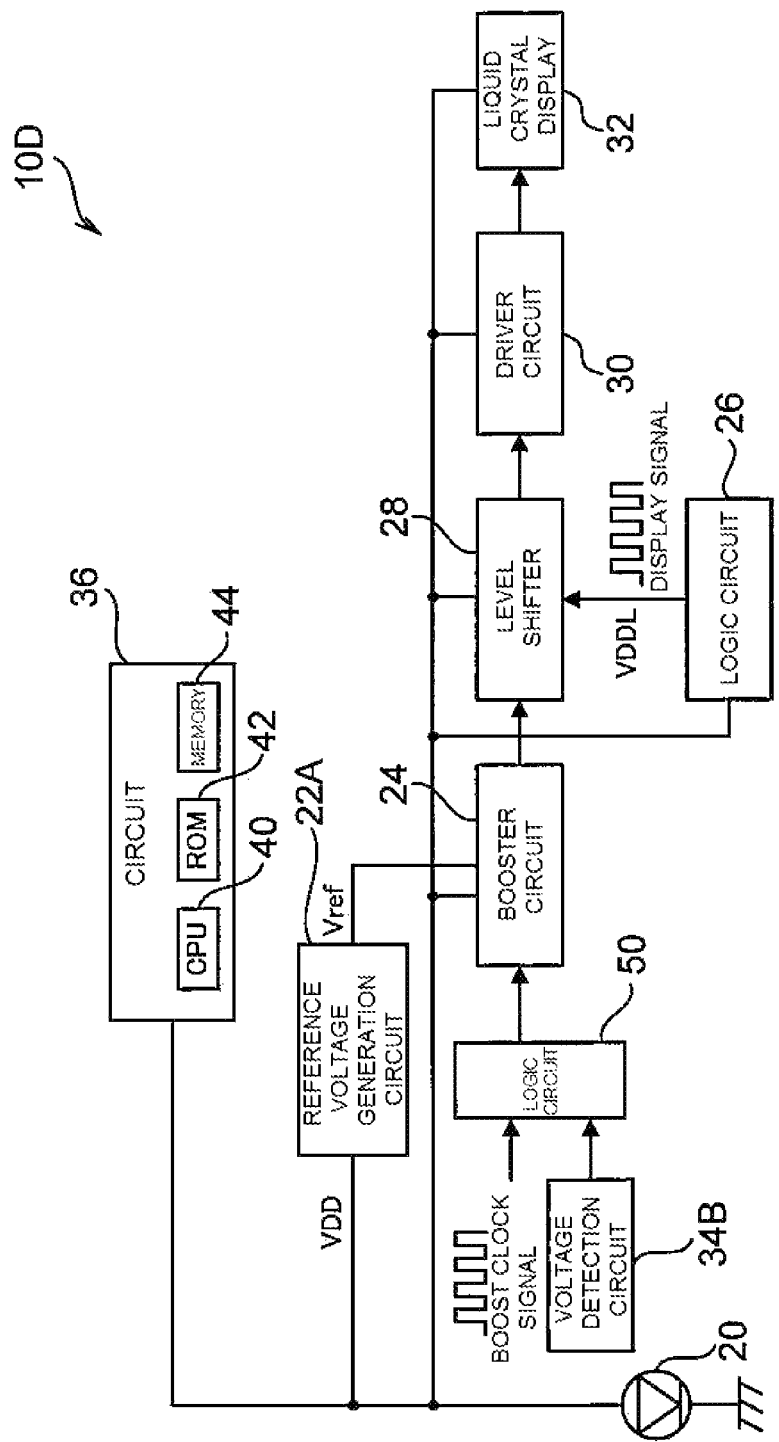
FIG. 12 is a block diagram illustrating an example of a configuration of a semiconductor device according to a third embodiment.

As illustrated in FIG. 12, the semiconductor device 10D includes a voltage detection circuit 34B instead of the voltage detection circuit 34A of the second embodiment. The voltage detection circuit 34B is different from the voltage detection circuit 34A in that it has a hysteresis characteristic.

Next, a configuration of the voltage detection circuit 34B will be described with reference to FIG. 13. Note that the constituent parts illustrated in FIG. 13 having the same function as those illustrated in FIG. 4 will be denoted with the same reference numeral as those in FIG. 4 and detailed description thereof will be omitted.

Figure 13:
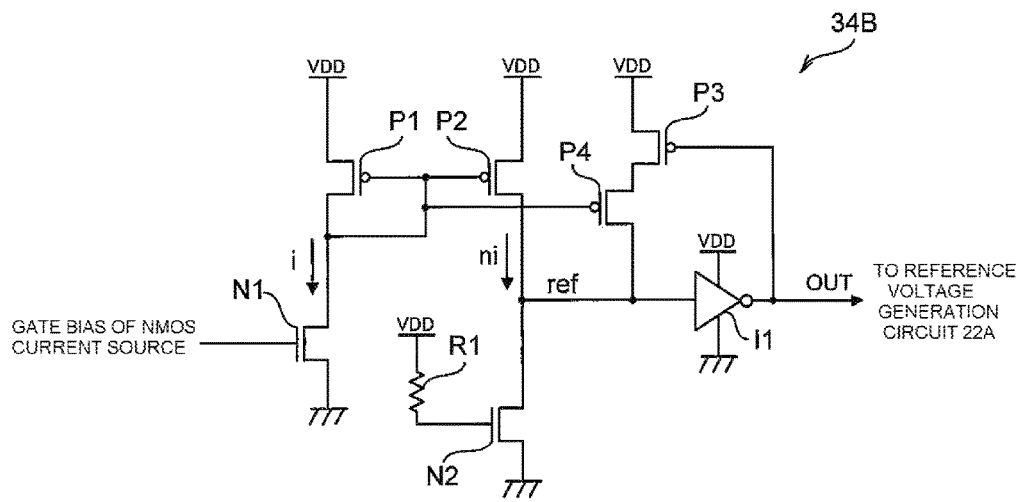
FIG. 13 is a circuit diagram illustrating an example of a configuration of a voltage detection circuit according to the third embodiment.

As illustrated in FIG. 13, the voltage detection circuit 34B further includes PMOS transistors P3 and P4. The source for the PMOS transistor P3 is connected with a power supply line configured to supply the power supply voltage VDD. The gate for the PMOS transistor P3 is connected with an output terminal of the inverter I1. The drain for the PMOS transistor P3 is connected with the source for the PMOS transistor P4. The gate for the PMOS transistor P4 is connected with the drain for the PMOS transistor P1. The drain for the PMOS transistor P4 is connected with the connection point ref.

Operation of the voltage detection circuit 34B according to the third embodiment will now be described. The PMOS transistor P3 according to the third embodiment is in an ON state when the output signal OUT from the inverter I1 is a low level signal, and when the output signal OUT from the inverter I1 is a high level signal it is in an OFF state. For example, in a case where the value of the power supply voltage VDD is equal to or greater than the threshold V1, the output signal OUT is a high level signal and the PMOS transistor P3 is in an OFF state. Accordingly, in this case, the operation of the voltage detection circuit 34B is the same as that of the voltage detection circuit 34A according to the hardware modification of the first embodiment and to the second embodiment.

On the other hand, in a case where the value of the power supply voltage VDD is less than the threshold V1, the output signal OUT is a low level signal and the PMOS transistor P3 is in an ON state. Accordingly, the power supply voltage VDD is supplied to the connection point ref via two current paths, namely, a current path from the PMOS transistor P2 and a current path from the PMOS transistors P3 and P4. Accordingly, in such a case, the value of the power supply voltage VDD rises to become equal to or greater than the threshold V1, and therefore the rate of potential drop of the connection point ref when the NMOS transistor N2 is in an ON state is slower than the voltage detection circuit 34A.

That is, in such a case, the time at which the output signal OUT from the interval I1 switches from a low level signal to a high level signal will be slower than the voltage detection circuit 34A. Accordingly, the output signals of the voltage detection circuit 34B do not change the levels when the value of the power supply voltage VDD is near the threshold V1.

Figure 14:
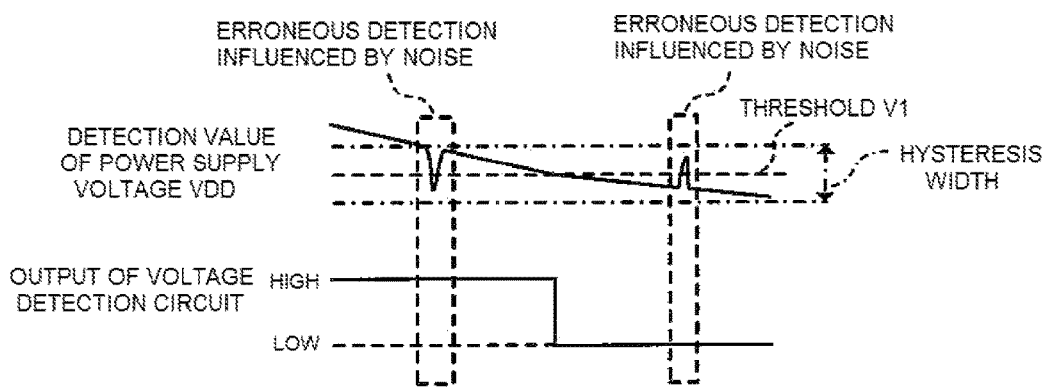
FIG. 14 is a timing chart illustrating an example of operation of the semiconductor device of the third embodiment.

Next, operation of the semiconductor device 10D according to the third embodiment will be described with reference to FIG. 14. Note that the description of the semiconductor device 10D will be focused solely on the differences between the operation of the semiconductor device 10D and the operation of the semiconductor device 10C. The topmost portion of FIG. 14 shows a value of the power supply voltage VDD detected by the voltage detection circuit 34A, and the portion below that shows the output signal from the voltage detection circuit 34B. Also, the dashed line in FIG. 14 shows a hysteresis width.

As shown in a rectangular portion in broken line in FIG. 14, there are occasions where the value of the power supply voltage as detected by the voltage detection circuit 34B may include an erroneous detection influenced by noise, or the like, or influenced by chattering. Due to the hysteresis characteristic of the voltage detection circuit 34B according to the third embodiment, even when the detected value of the power supply voltage VDD exceeds or falls below the threshold V1 within the hysteresis width due to the erroneous detection or the influence of chattering, the level of the output signal of the voltage detection circuit 34B remains unswitched. Accordingly, the third embodiment is operable to obtain similar effects as those obtained by the first embodiment and the second embodiment, and to suppress the influence of the erroneous detection or the influence of chattering.

<Fourth Embodiment>

The configuration of a semiconductor device 10E according to a fourth embodiment will now be described with reference to FIG. 15. Note that the constituent parts illustrated in FIG. 15 having the same function as those illustrated in FIG. 12 will be denoted with the same reference numerals as those in FIG. 12 and detailed description thereof will be omitted.

Figure 15:
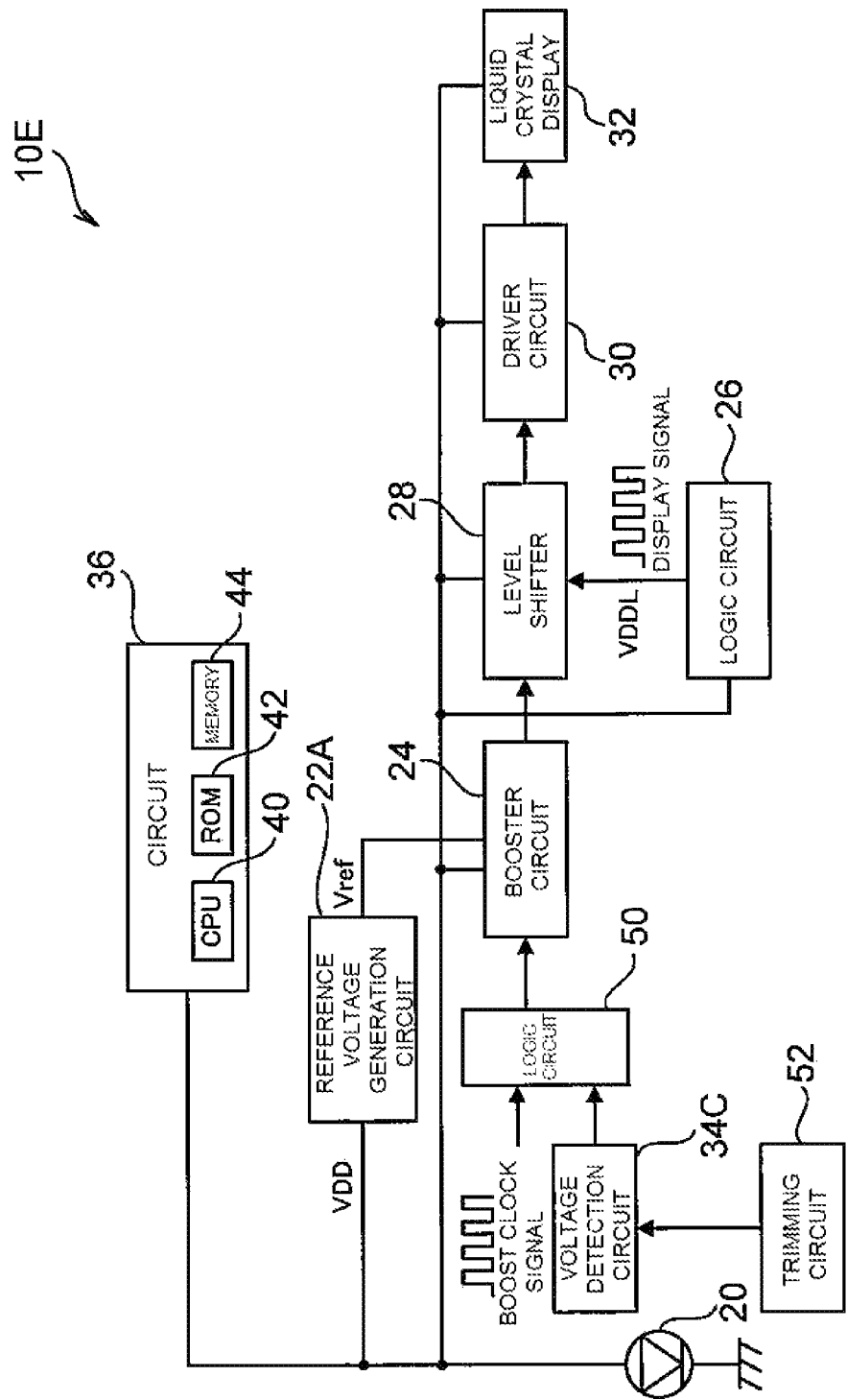
FIG. 15 is a block diagram illustrating an example of a configuration of a semiconductor device according to a fourth embodiment.

As illustrated in FIG. 15, the semiconductor device 10E includes a voltage detection circuit 34C instead of the voltage detection circuit 34B of the third embodiment. The semiconductor device 10E further includes a trimming circuit 52. The trimming circuit 52 according to the fourth embodiment trims (nudges) and modifies the threshold V1 which includes a standard at which the level of the output signal from the voltage detection circuit 34C is switched.

Next, a configuration of the voltage detection circuit 34C and that of the trimming circuit 52 according to the fourth embodiment will be described with reference to FIG. 16. Note that the constituent parts illustrated in FIG. 16 having the same function as those illustrated in FIG. 13 will be denoted with the same reference numerals as those in FIG. 13 and detailed description thereof will be omitted.

Figure 16:
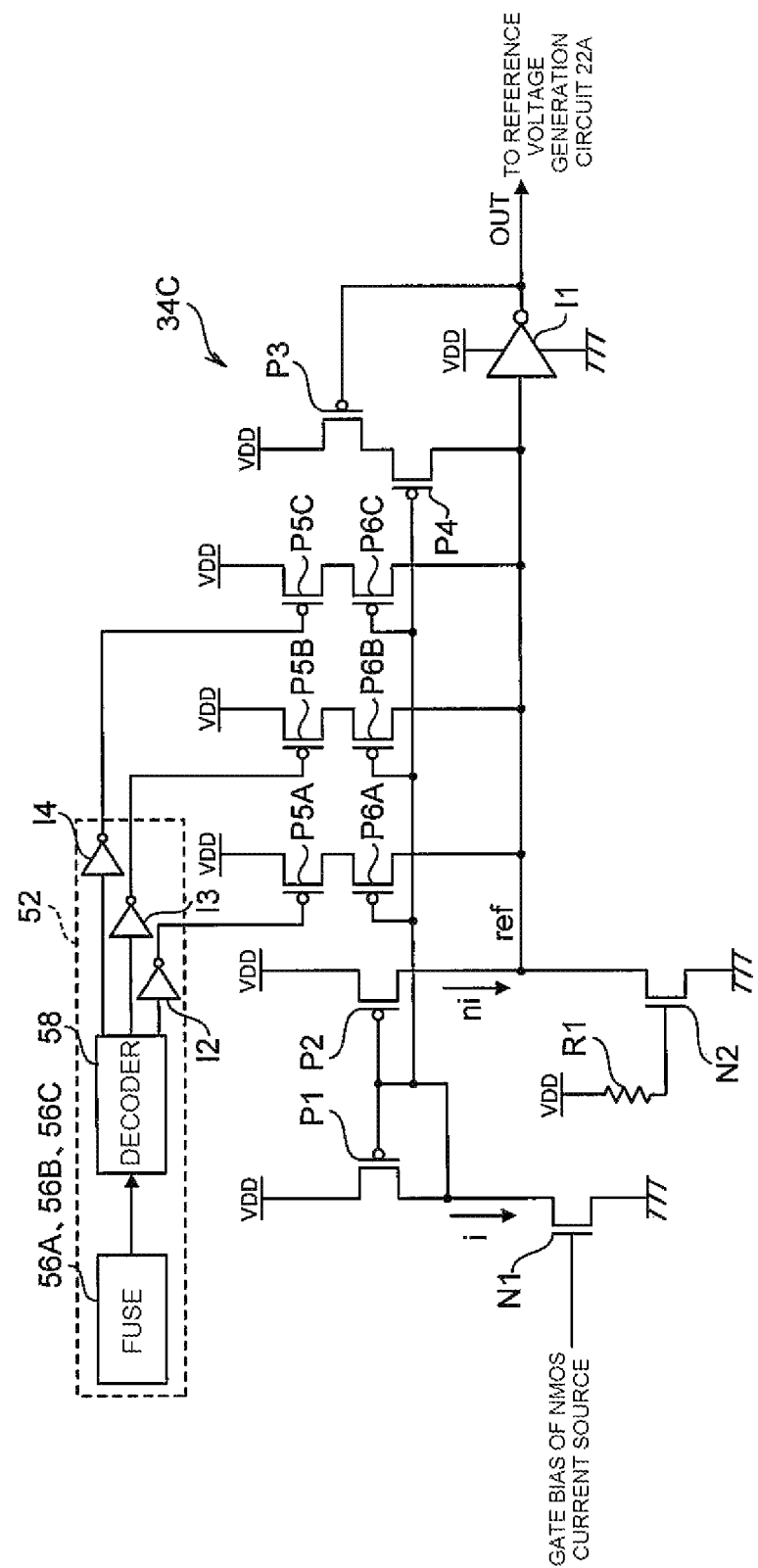
FIG. 16 is a circuit diagram illustrating an example of a configuration of a voltage detection circuit according to the fourth embodiment.

As illustrated in FIG. 16, the voltage detection circuit 34C further includes PMOS transistors P5A through P5C and P6A through P6C. Note that when there is no need to distinguish one of the PMOS transistors P5A through P5C from another, the capital letter at the end of the reference numeral will be omitted. Also note that there is no need to distinguish one of the PMOS transistors P6A through P6C from the others, a letter indicated at the end of the reference numeral will be omitted.

As illustrated in FIG. 16, each PMOS transistor P5 and P6 includes the same configuration, and a set of three series-connected pairs of a PMOS transistor P5 and a PMOS transistor P6 are arranged in a parallel manner in the voltage detection circuit 34C. Also, the trimming circuit 52 according to the fourth embodiment includes the same number of fuses 56A through 56C (3 according to this embodiment) as the numbers of combination of the PMOS transistors P5, PMOS transistors P6 and inverters 12 through 14, and also includes a decoder 58.

The source of each PMOS transistor P5 is connected with a power supply line configured to supply the power supply voltage VDD. The drain of each PMOS transistor P5 is connected with the source of the PMOS transistor P6. The gate of each PMOS transistor P6 is connected with the drain of the PMOS transistor P1. The drain of each PMOS transistor P6 is connected with the connection point ref.

The PMOS transistors P5A, P5B and P5C correspond respectively to the inverters 12, 13, and 14. The gates of PMOS transistor, P5A, P5B and P5C are connected with output terminals of the corresponding inverters 12, 13, and 14.

The fuses 56A through 56C are arranged in a manner corresponding to the PMOS transistors P5A through P5C. The decoder 58 detects whether or not any one of the fuses 56A through 56C has melted. Then, the decoder 58 decodes the detected status of the fuses 56A through 56C into a signal configured to control the ON/OFF state of the corresponding PMOS transistors P5A through P5C. Further, the decoder 58 outputs the decoded signal to the corresponding PMOS transistors P5A through P5C via corresponding inverters P5A through P5C.

Accordingly, the voltage detection circuit 34C, the threshold V1 of which serves as a standard for switching ON or OFF state of the PMOS transistors P5A through P5C, may be modified in a precise manner. Note that the number of combinations of the PMOS transistor P5 and the PMOS transistor P6 is not limited to 3 as described above; it goes without saying that depending on the range of variation of desired threshold V1 the combination may be other than 3.

Next, trimming by the trimming circuit 52 will be described. The semiconductor device 10E due to unevenness of the manufacturing process of the constituent parts, or the like, may include a varied lower limit (a value corresponding to the threshold V1) of the value of the power supply voltage VDD at which a through current starts to flow through the level shifter 28. Therefore, according to the fourth embodiment, a process of testing the semiconductor device 10E after it is manufactured may include a trimming process performed by the trimming circuit 52.

An inspector performing the test of the semiconductor device 10E applies voltage to the manufactured semiconductor device 10E, and measures the lower limit of the value at which a through current starts to flow through the level shifter. Also, the inspector determines the ON/OFF state of the PMOS transistors P5A through P5C so that the threshold V1 matches, or approximately matches, the lower limit of the measured value. Then, the inspector melts the fuses 56A through 56C so that the ON/OFF state of the PMOS transistors P5A through P5C is determined.

Note that the operation of the semiconductor device 10E is the same as the operation of the semiconductor device 10D according to the third embodiment, and therefore the description thereof will be omitted.

As described above, the fourth embodiment is operable to obtain similar effects as those obtained by the first embodiment through the second embodiment described above. Also, according to the fourth embodiment the threshold V1 is modified in accordance with the unevenness of the manufacturing process of the semiconductor device 10E, and therefore it becomes possible to accurately suppress a through current from flowing through the level shifter 28.

While the ON/OFF state for the PMOS transistors P5A through P5C according to the fourth embodiment is determined in accordance with the state of the fuses 56A through 56C, the invention is not limited thereto. The ON/OFF state for the PMOS transistors P5A through P5C may, for example, be determined in a manner where information pertaining to the ON/OFF state for the PMOS transistors P5A through P5C is stored in the memory 44 and the PMOS transistors P5A through P5C read the information stored at the memory 44 so as to determine the ON/OFF state for the PMOS transistors P5A through P5C.

Also, while the semiconductor device 10D according to the third embodiment includes the trimming circuit 52 and the voltage detection circuit 34B includes the transistors P5 and P6, the invention is not limited thereto. For example, the semiconductor device 10B according to the hardware modification of the first embodiment and the semiconductor device 10C according to the second embodiment may be configured to include the trimming circuit 52 and the voltage detection circuit 34A may for example be configured to include the PMOS transistors P5 and P6.

While each embodiment of the invention has been described above, the technical scope of the invention is not limited to the embodiments described above. It is to be noted that the invention may include various modifications and improvements of the invention in addition to those described herein, and such modifications and improvements are intended to fall within the scope of the invention.

Also, note that each embodiment described above is not intended to limit the scope of the claims and that not all of the combinations of the characteristics described above in connection with each embodiment are necessary to solve the problem for which this invention is intended. Each embodiment described herein contains inventions of various stages, and these inventions may be extracted from various combinations of a plurality of constituents described herein. Even if some constituents are excluded from all of the constituents described above in connection with each embodiment, as long as desired effect is obtained, the configuration from which the some constituents are excluded may be extracted as an invention disclosed herein.

For example, while the voltage detection circuits 34A through 34C according to the embodiments described above include the inverter I1, the invention is not limited thereto. The voltage detection circuits 34A through 34C may include a comparator. In such case, the power supply voltage VDD may be inputted to a non-inverted input terminal of the comparator and the voltage of the threshold V1 may be inputted to an inverted input terminal. Also, when a configuration allows different types of signals to be outputted depending on whether the value of the power supply voltage VDD is less than the threshold V1 or equal to or greater than the threshold V1, the configuration of the voltage detection circuits 34A through 34C are not limited to those described above.

Also, while a configuration in which the operation of the reference voltage generation circuits 22 and 22A and the output of the boost clock signal are stopped depending on whether or not the value of the power supply voltage VDD is less than the threshold V1 is described above, the invention is not limited thereto. For example, a configuration in which the operation of the reference voltage generation circuits 22 and 22A and the outputting of the boost clock signal are stopped depending on whether or not the value of the current flowing from the solar battery 20 which generates the power supply voltage VDD is less than a predetermined threshold V2 may be implemented. In such case, the threshold V2 may, for example, be configured to include a value (with or without a margin added thereto) such as a lower limit of a value of current from a power supply at which a through current starts flowing to the level shifter 28, which is determined for example experimentally using the semiconductor devices 10A through 10E or computer simulations based on design specifications of the semiconductor devices 10A through 10E.

Also, while a configuration in which the value of the power supply voltage VDD is detected by one of the voltage detection circuits 34 and 34A through 34C according to the embodiments above is described herein, the invention is not limited thereto. The invention may, for example, include a configuration in which the value of a voltage VDDL of the status signal inputted to the level shifter 28 is detected by the voltage detection circuit 34, 34A, 34B or 34C.

Also, while a configuration in which a solar battery supplies the power is described above, the invention is not limited thereto. It goes without saying that the invention may include a power source other than the solar battery.

Also, while a configuration in which the drive control process program is preinstalled in the ROM 42 is described above, the invention is not so limited. The invention may, for example, include a configuration in which the drive control process program is stored in and supplied from a storage medium such as CD-ROM (Compact Disk Read Only Memory), or the like, or supplied via a network.

Also note that the configuration of each semiconductor device and each circuit described above in connection with the disclosed embodiments (see FIG. 1, FIG. 3, FIG. 4, FIGS. 6 through 10, FIG. 12, FIG. 13, FIG. 15, and FIG. 16) is merely an example; it goes without saying that the invention may include, without departing from the scope of the invention, a configuration where a new component is added or an unnecessary component is deleted.

Also, the above described flow (see FIG. 2) of the drive control process according to the first embodiment is merely an example thereof, and may include a new step, delete an unnecessary step, or change the processing order without departing from the scope of the invention.

According to the invention, it becomes possible to suppress a through current from flowing through a converter without stopping the entire device.

What is claimed is:

1. A semiconductor device for controlling a display device, comprising:
   a generation circuit configured to receive a power supply voltage, generate a reference voltage from the power supply voltage, and output the reference voltage;
   a booster circuit connected to the generation circuit, and being configured to boost the reference voltage received from the generation circuit, generate a bias voltage and output a boosted reference voltage;
   a conversion circuit connected to the booster circuit, and being configured to receive the boosted reference voltage, the conversion circuit, receiving a status signal and being configured to convert a voltage level of the status signal to that of the bias voltage, for controlling drive of the display device, the status signal being generated from the power supply voltage; and
   a control circuit configured to stop an operation of at least one of the generation circuit and the booster circuit when one of a value of the power supply voltage and a value of a power supply current flowing from a power supply that generates the power supply voltage is lower than a predetermined threshold, the control circuit being configured to supply at least one of a first control signal to the generation circuit and a second control signal to the booster circuit for stopping the operation of the at least one of the generation circuit and the booster circuit.

2. The semiconductor device according to claim 1, wherein the control circuit is configured to resume the operation of the at least one of the generation circuit and the booster circuit stopped by the control circuit when one of the value of the power supply voltage and the value of the power supply current is equal to or greater than the threshold.

3. The semiconductor device according to claim 1, wherein the control circuit has a hysteresis characteristic for an operation subject to control.

4. The semiconductor device according to claim 1, wherein the control circuit includes:
  a detection circuit configured to detect whether or not one of the value of the power supply voltage and the value of the power supply current flowing from the power supply that generates the power supply voltage is lower than the predetermined threshold; and
  an operation control circuit configured to stop the operation of the at least one of the generation circuit and the booster circuit in accordance with a result of the detection by the detection circuit.

5. The semiconductor device according to claim 1, wherein the power supply includes a solar battery.

6. The semiconductor device according to claim 1, wherein the booster circuit includes a charge pump circuit.

7. The semiconductor device according to claim 1, wherein the generation circuit generates the reference voltage from the power supply voltage.

8. The semiconductor device according to claim 1, further comprising a modification circuit configured to modify the threshold.

9. The semiconductor device according to claim 1, further comprising a setting circuit configured to set the threshold to a value approximately the same as a maximum value of the power supply voltage which is measured after the semiconductor device is manufactured and at which a through current starts to flow through the conversion circuit.

10. A semiconductor device for controlling a display device, comprising:
  a generation circuit configured to receive a power supply voltage and generate a reference voltage from the power supply voltage to output the reference voltage;
  a booster circuit connected to the generation circuit, and being configured to boost the reference voltage received from the generation circuit, based on a clock signal inputted thereto, to generate a bias voltage and output a boosted reference voltage;
  a conversion circuit connected to the booster circuit, and being configured to receive the boosted reference voltage, the conversion circuit, receiving a status signal and being configured to convert a voltage level of the status signal to that of the bias voltage, for controlling drive of the display device, the status signal being generated from the power supply voltage; and
  a switching circuit connected to the booster circuit, and being configured to, after the clock signal is inputted thereto, switch between outputting and stopping to output the clock signal to the booster circuit depending on whether or not one of a value of the power supply voltage and a value of a power supply current from a power supply generating the power supply voltage is equal to or greater than a predetermined threshold.

11. The semiconductor device according to claim 10, wherein the control circuit has a hysteresis characteristic for an operation subject to control.

12. The semiconductor device according to claim 10, wherein the power supply includes a solar battery.

13. The semiconductor device according to claim 10, wherein the booster circuit includes a charge pump circuit.

14. The semiconductor device according to claim 10, wherein the generation circuit generates the reference voltage from the power supply voltage.

15. The semiconductor device according to claim 10, further comprising a modification circuit configured to modify the threshold.

16. The semiconductor device according to claim 10, further comprising a setting circuit configured to set the threshold to a value approximately the same as a maximum value of the power supply voltage which is measured after the semiconductor device is manufactured and at which a through current starts to flow through the conversion circuit.

17. A method of controlling a semiconductor device for controlling a display device, the display device including a generation circuit, a booster circuit connected to the generation circuit, a conversion circuit connected to the booster circuit, and a control circuit connected to the generation circuit, the method comprising:
  receiving by the generation circuit, a power supply voltage and generating a reference voltage from the power supply voltage;
  boosting by the booster circuit, the reference voltage to generate a bias voltage;
  converting by the conversion circuit, a voltage level of a status signal generated from the power supply voltage to that of the bias voltage for controlling drive of the display device; and
  stopping by the control circuit, either or both of the generation and the boosting of the reference voltage when either the power supply voltage or a power supply current flowing from a power supply that generates the power supply voltage is lower than a predetermined threshold.

18. The semiconductor device according to claim 1, wherein the control unit stops the operation of at least one of the generation unit and the booster unit only when one of the value of the power supply voltage and the value of a power supply current flowing from a power supply that generates the power supply voltage is lower than the predetermined threshold.

19. The semiconductor device according to claim 10, wherein the switching circuit stops outputting the clock signal only when the one of the values of the power supply voltage and the power supply current is lower than the predetermined threshold.

* * * * *